(12) United States Patent
Yeh

(10) Patent No.: US 9,542,517 B2
(45) Date of Patent: Jan. 10, 2017

(54) TECHNIQUES FOR FAST RESONANCE CONVERGENCE

(71) Applicant: Taiwan Semiconductor Manufacturing Co., Ltd., Hsin-Chu (TW)

(72) Inventor: Chao-Yang Yeh, Luzhou (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 312 days.

(21) Appl. No.: 14/144,845

(22) Filed: Dec. 31, 2013

(65) Prior Publication Data

US 2014/0183692 A1 Jul. 3, 2014

Related U.S. Application Data

(60) Provisional application No. 61/747,460, filed on Dec. 31, 2012.

(51) Int. Cl.
*G06F 9/455* (2006.01)
*G06F 17/50* (2006.01)

(52) U.S. Cl.
CPC ....... *G06F 17/5045* (2013.01); *G06F 17/5063* (2013.01)

(58) Field of Classification Search
USPC ......................................................... 716/133
See application file for complete search history.

(56) References Cited

U.S. PATENT DOCUMENTS

| | | | | | |
|---|---|---|---|---|---|
| 5,357,379 | A | * | 10/1994 | Gower | G11B 5/022 360/46 |
| 6,011,345 | A | * | 1/2000 | Murray | H01L 41/042 310/316.01 |
| 2003/0125922 | A1 | * | 7/2003 | Grochowski | G06F 1/26 703/18 |
| 2004/0202215 | A1 | * | 10/2004 | Fairgrieve | G11B 7/126 372/38.02 |
| 2005/0110551 | A1 | * | 5/2005 | Bonaccio | G11C 5/14 327/310 |

OTHER PUBLICATIONS

U.S. Appl. No. 13/172,248, filed Jun. 29, 2011.
Smith, et al. "Chip-Package Resonance in Core Power Supply Structures for a High Power Microprocessor." Proceedings of IPACK'01. Jul. 8-13, 2001. 6 Pages.
Wikipedia.org "LC Circuit." Jul. 26, 2013. 10 Pages.
Altera. "Device-Specific Power Delivery Network (PDN) Tool User Guide." Sep. 2012. 32 Pages.

* cited by examiner

*Primary Examiner* — Bryce Aisaka
(74) *Attorney, Agent, or Firm* — Eschweiler & Associates, LLC

(57) ABSTRACT

Some methods provide an electronic design file, which includes an integrated circuit (IC) component that is operably coupled to a package component. The IC component and package component collectively form a resistor inductor capacitor (RLC) resonant circuit. The method also provides a damping component in the electronic design file. This damping component is configured to reduce a pre-resonant time during which energy exchanged in the RLC resonant circuit approaches a steady-state, and thereby speeds simulation time.

19 Claims, 5 Drawing Sheets

US 9,542,517 B2

TECHNIQUES FOR FAST RESONANCE CONVERGENCE

CROSS REFERENCE TO RELATED APPLICATIONS

This application is a Non-provisional Application claiming priority to U.S. Provisional Patent Application Ser. No. 61/747,460 filed on Dec. 31, 2012 in the name of Chao-Yang Yeh, which is entitled "FAST RESONANCE CONVERGENCE BY INSERTION OF A DAMPING COMPONENT WITH A TIME-DEPENDENT RESISTIVITY IN THE LC-CIRCUIT UNDER TEST" and which is hereby incorporated by reference in its entirety.

BACKGROUND

An integrated circuit (IC) is an electronic circuit formed on a small piece of semiconducting material, typically silicon. ICs are used in virtually all electronic equipment today and have revolutionized the world of electronics. Computers, mobile phones, and other digital home appliances, which are made possible by the low cost of ICs, are now inextricable parts of modern societies. ICs can be made very compact, having up to several billion transistors and other electronic components on a piece of semiconducting material about the size of a fingernail. Feature sizes of ICs, such as the width of each conducting line, are made smaller and smaller for successive generations of technology. For example, in 2008 the width of each conducting line dropped below 100 nanometers and in 2013 is in the tens of nanometers.

Despite the ever shrinking feature size for successive technology nodes, the overall power consumption per unit area has remained the same or even tended to increase for successive technology nodes. This is because of the increased density at which devices are packed on the ICs and because of the higher operating frequencies for the newer devices. To help curtail this increase in power consumption between successive technology nodes, newer technology nodes typically utilize lower supply voltages than previous technology nodes. For example, whereas a typical IC made according to a 0.6 µm technology node was powered with a 5 volt DC supply, more recent ICs at the 0.13 µm technology node are powered with a 1.2 volt DC supply. As supply voltages have decreased, the voltage drop which can be tolerated between the supply rails has also decreased. For example, if a 5% supply rail drop is tolerable, a 5 V supply could tolerate a 250 mV voltage drop, but a 1.2 V supply can tolerate only a 60 mV drop. Thus, for modern technology nodes where supply voltages are decreasing, it is becoming more and more important to accurately model supply rail voltages.

DETAILED DESCRIPTION

Figure 1:
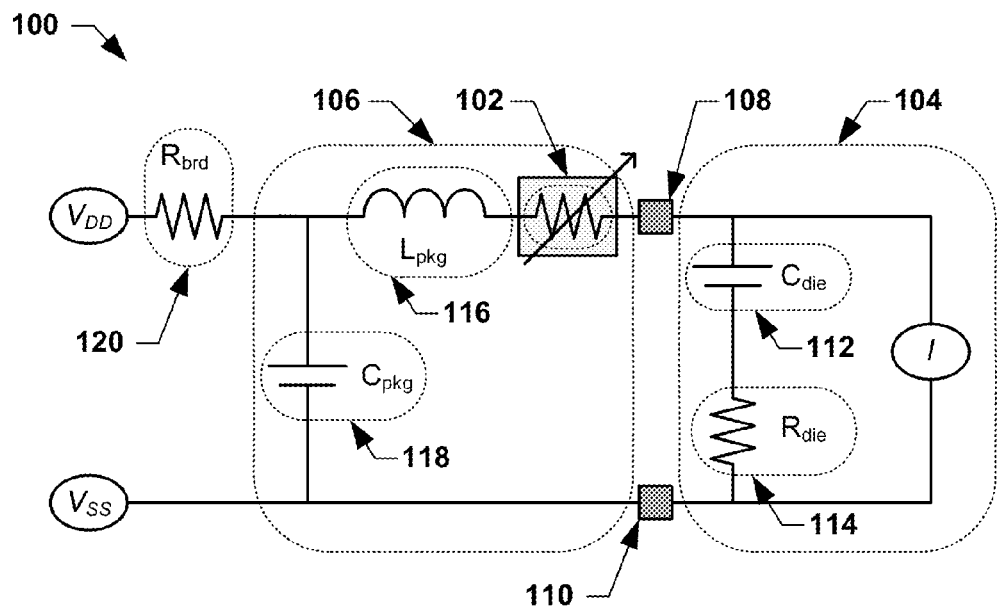
FIG. 1 illustrates some embodiments of an electronic design file that includes a damping component with a variable resistance.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Although supply voltages are often thought of as being continuously fixed at some DC offset (e.g., a fixed 5V DC offset for 0.6 µm technology, or a fixed 1.2 V DC offset for a 0.13 µm technology), supply voltages can actually have small dynamic changes in time. One source of dynamic changes in supply rail voltage arises due to cases or "packages" which surround ICs and which are structured to protect the ICs from physical damage and corrosion. Although a package is beneficial in that it protects its encased IC from physical damage and corrosion to some extent, the package is also a source of parasitic inductance and parasitic capacitance for the IC. Thus, the inductance and capacitance of the package forms an RLC circuit with the IC itself, potentially resonating at some characteristic frequency. If left un-checked, this resonance can cause oscillations in supply rail voltage for the packaged IC, as well as other types of noise for the packaged IC. Therefore, it is often useful for IC designers to simulate the packaged IC, which includes this RLC circuit, to model how power is exchanged between the IC and the package.

In particular, when power is initially supplied to the packaged IC during simulation of the packaged IC, there is a pre-resonant period before the RLC circuit enters a steady-state of resonance. In many instances, this pre-resonant period can be a substantial portion of the overall simulation time. However, for an actual manufactured IC, this pre-resonant time is of short duration in real time, and the actual packaged IC will run for most practical purposes after the RLC circuit has achieved resonance. Therefore, although it is desirable to simulate the steady-state resonant condition on the packaged IC, it would be advantageous to limit simulation time leading up to the steady state resonant condition (i.e., it would be advantageous to limit the portion of the simulation which models the pre-resonant time).

Some embodiments of the present disclosure provide for techniques for simulating a packaged IC, which is represented as an electronic design file. In these techniques, a damping component is inserted into the electronic design file to quickly damp an RLC circuit until the RLC circuit reaches its steady-state resonant frequency. Thus, the damping component is inserted into the simulation as a way to shorten the simulation time for the RLC circuit to reach the resonant condition, which is the point at which the simulation becomes meaningful to the circuit designer.

FIG. 1 illustrates some embodiments of an electronic design file 100 in which a damping component 102 is used to shorten simulation time in accordance with some embodiments. The electronic design file 100 includes an IC component 104 and a package component 106, which are connected by first and second pins 108, 110. The first and second pins represent connections (e.g., wirebonds, solder bumps, through-vias, or other connection structures) between the IC component 104 and package component 106. The IC component 104 and package component 106 collectively include various R, L, and C components, which can be parasitic components or actual instantiations of active or passive devices. In FIG. 1's example, the IC component 104 includes capacitance ($C_{die}$) 112 and resistance ($R_{die}$) 114; while the package component 106 includes inductance ($L_{pkg}$) 116 and capacitance ($C_{pkg}$) 118. Board resistance ($R_{brd}$) 120 represents a resistance between a printed circuit board (PCB) or other voltage source and the first and second pins 108, 110. Collectively, these R, L, C components establish an RLC circuit.

Figure 2:
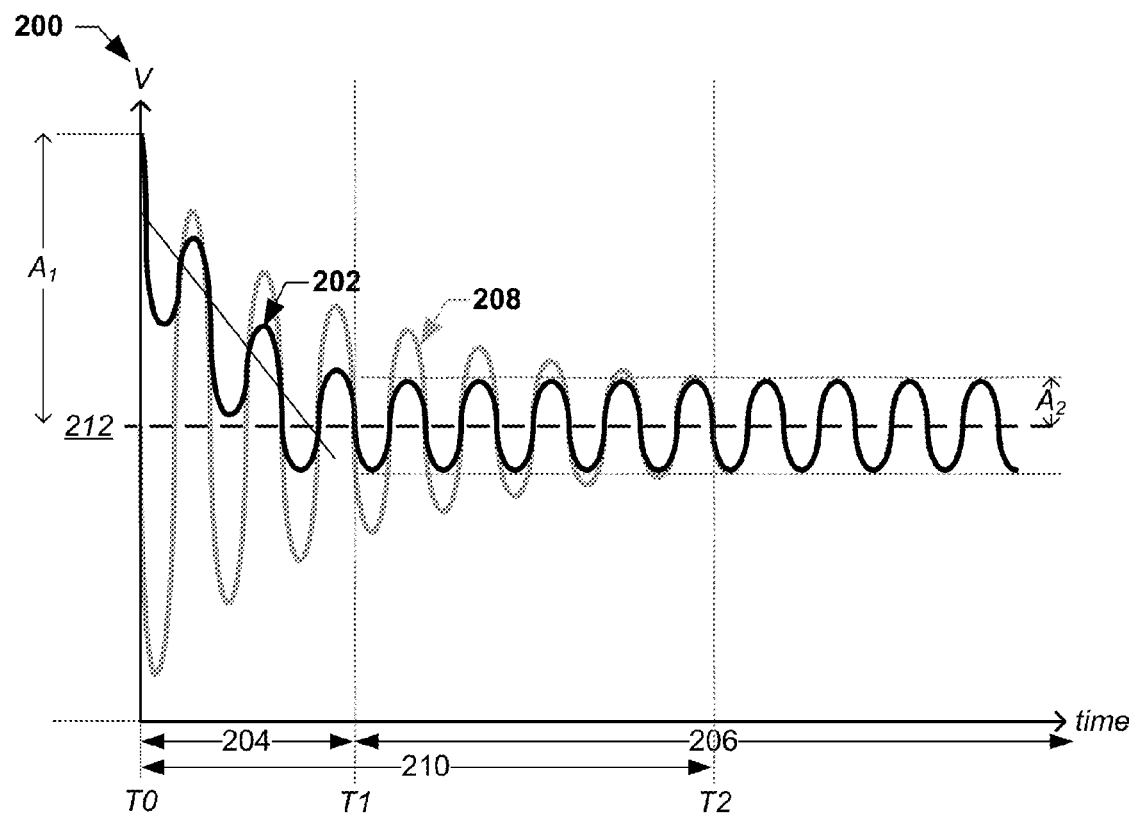
FIG. 2 illustrates some embodiments of a waveform illustrating an example of how a damping component with a variable resistance can reduce a pre-resonant time relative to other solutions.

Damping component 102 in the electronic design file 100 reduces pre-resonant time of this RLC circuit during simulation. In particular, the damping component 102 has a time-variant RLC characteristic, for example a time-dependent resistance, to quickly damp the RLC circuit to achieve resonance. As shown in FIG. 2, with the damping component 102 in place, the voltage signal 202 between the first and second pins 108, 110 exhibits some initial pre-resonant time 204 during which packaged IC of the electronic design file 100 exhibits a rapidly varying, non-resonant frequency about a target DC voltage 212, due to the RLC circuit. Thus, during this pre-resonant time 204 an envelope of the voltage signal 202 decays exponentially from amplitude (+/−) A1 at time T0 until a steady-state resonant condition with amplitude (+/−) A2 is achieved at time T1. Thus, at time T1, the RLC circuit reaches a steady state of resonance having voltage level that oscillates about target voltage 212, as shown by amplitude A2. For example, if a 5% supply rail drop is the maximum acceptable rail drop, during time 206: for a 0.6 μm technology node having a target DC voltage 212 equal to 5.0V, the voltage level can reliably oscillate between 5.25 V and 4.75 V; while for a 0.13 μm technology node having a target DC voltage 212 equal to 1.2 V, the voltage level can reliably oscillate between 1.26 V and 1.14 V. At time T1, in view of this steady state RLC oscillation functional tests are now first injected into the simulation to test the circuitry of the packaged IC. For example, during time 206, test vectors can be applied to the IC via the first and second pins 108, 110; simulated test results can be returned from the IC through the pins 108, 110; and the simulated test results can be compared to expected test results to determine if the packaged IC is operating as desired. If the simulated test results are not equal to the expected test results, due to the amplitude of the voltage signal 202 exceeding some predetermined threshold level, then the design can be revised to remedy the failures.

For comparison, curve 208 shows a hypothetical simulation without the damping component 102 in place. Notably, curve 208 has a pre-resonant time 210 ending at T2, which is substantially longer than the corresponding pre-resonant time 204 of voltage signal 202. Thus, for curve 208, functional tests would not be injected into the simulation until T2, and thus the overall length of simulation would be longer.

Accordingly, by allowing the steady-state resonant condition to be reached more quickly during simulation, the damping component 102 allows the remainder of the simulation to be carried out sooner than with other approaches. Thus, when the remainder of the simulation applies functional test vectors to the IC while accounting for RLC effects of the package, the simulation test results will be acquired more quickly than with other approaches. This allows faster design turnaround, which can reduce labor costs associated with designing an IC and get the IC to market faster than with other approaches.

In some embodiments, the damping component 102 is present during simulation and is also present on the final manufactured IC. In such instances, the damping component 102 may help to provide fast damping of any RLC circuits during a start-up mode for the manufactured IC to help ensure supply voltages on the supply rails are keep at reliable levels. This can help to ward off any start up errors. Thus, the circuit in FIG. 1 can be implemented as an actual integrated circuit formed on a piece of semiconductor material, and with a surrounding package 106.

In other embodiments, however, the damping component 102 may be present only during simulation, and will removed from the design prior to fabrication. Thus, the final IC in these instances will not include the damping component 102. One advantage of leaving the damping component 102 off the final IC is that the damping component 102 may be perceived as possibly adding some small residual resistance into the supply rails of the packaged IC. For successive generations of technology, each of which has increased power consumption per unit area with a lower supply voltage compared to previous generations, currents tend to be higher. To limit supply voltage drop, the resistance of the supply lines is typically reduced between successive generations—thereby limiting so called "IR drop" problems. If the damping component 102 is perceived to add additional resistance, it may be left out of the final taped-out design to limit "IR drop" issues.

In addition, it is noted that although the damping circuit 102 is illustrated as being included within the package component 106, the damping circuit 102 can be included on the IC component 104 or can be otherwise coupled to the package component 106 and/or IC component 104. In various embodiments, values for $L_{pkg}$, $C_{pkg}$, and $R_{brd}$ for the inductive, capacitive, and resistive components of the electronic design file 100 of FIG. 1 can be measured from hardware of an actual package; while values for capacitive and resistive components $C_{die}$, $R_{die}$ can be modeled from a layout representation of the IC component 104 with an industry-standard layout extraction tool. These measured and model values can collectively be referred to as "RLC values." After the RLC values are determined, the voltage-time signal 202 can be simulated by a circuit simulation tool, such as a Simulation Program with Integrated Circuit Emphasis (SPICE) software. In an exemplary embodiment of the electronic design file 100 of FIG. 1 and associated voltage-time characteristic 200 of FIG. 2, values for electrical parameters comprise a $C_{die}$ 112 in a range of about 10 nF to about 20 nF, an $R_{die}$ 114 in a range of about 1 mΩ to about 5 mΩ, an $L_{pkg}$ 116 in a range of about 200 pH to about 300 pH, a $C_{pkg}$ 118 in a range of about 0.1 nF to about 10 nF, and a $R_{brd}$ 120 in a range of about 0.1 mΩ to about 5 mΩ.

Figure 3:
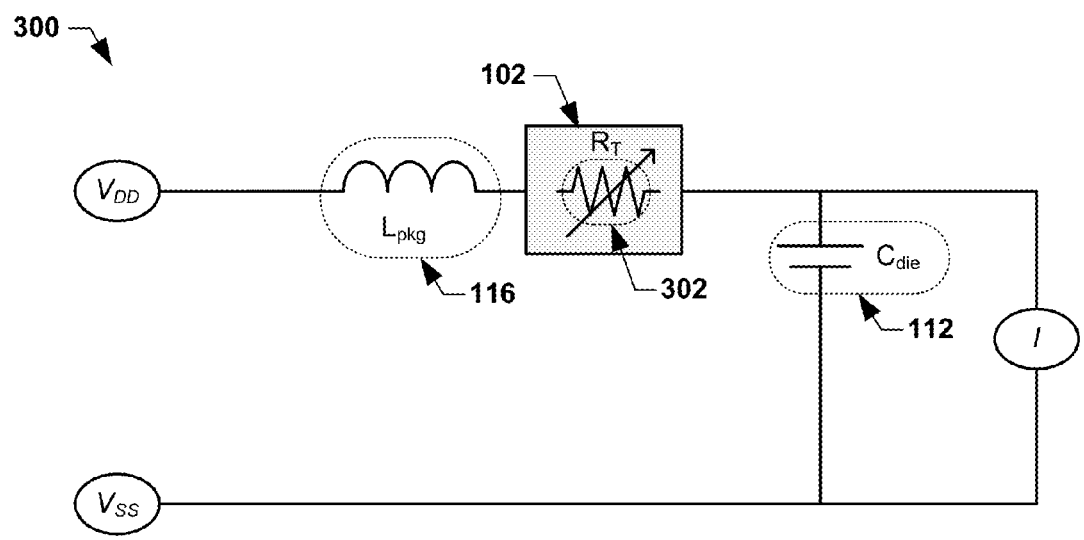
FIG. 3 illustrates some embodiments of the electronic design file of FIG. 1 represented by an RLC-Loop.

FIG. 3 illustrates some embodiments of the electronic design file 100 of FIG. 1 represented by an RLC-Loop 300.

For the embodiments of FIG. 3, previously illustrated $C_{pkg}$ 118 from FIG. 1 is significantly smaller than $C_{die}$ 112 and thus can be neglected. Additionally, the die resistance ($R_{die}$) 114 and board resistance ($R_{brd}$) 120 previously illustrated in FIG. 1, which are also very small typically, may also be neglected in the RLC-Loop 300 to evaluate the resonant state. Because of these approximations, $L_{pkg}$, $C_{die}$, and a time-variant resistance $R_T$ in damping circuit form a series RLC circuit, which has a damping factor equal to $R_T/2*(C_{die}/L_{pkg})^{1/2}$. To achieve critical damping, the damping factor is equal to one, such that the critical damping resistance $R_T$ of the RLC-Loop 300 is equal to $2\times(L_{pkg}/C_{die})^{1/2}$. The resonant period of the RLC-Loop 300 is $2\pi(L_{pkg}\times C_{die})^{1/2}$. The damping component 102 comprises a resistor 302 with a time-dependent resistance ($R_T$). To determine the nature of the time-dependence of the resistor 302, the critical damping resistance of $2\times(L_{pkg}/C_{die})^{1/2}$ and the resonant period of $2\pi(L_{pkg}\times C_{die})^{1/2}$ of the RLC-Loop 300 are utilized. Several examples of the damping component 102 and associated time-dependence are discussed in detail in the embodiments of FIGS. 4A-4B and FIGS. 5A-5B.

In some embodiments of the electronic design file 100, the damping component 102 may be added adjacent to each inductor of the RLC-Loop 300. In some embodiments of the RLC-Loop 300, where a dynamic voltage drop analysis for a packaged IC is modeled, the damping component 102 is added at ports which represent power connections between the IC component 104 and package component 106 (e.g., first pin 108 of FIG. 1).

Figure 4A:
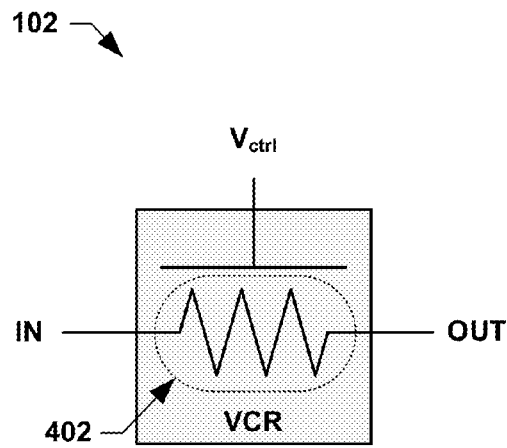
FIGS. 4A-4B illustrate a schematic representation of some embodiments of the damping component of FIG. 1 and associated resistance-time characteristic, which varies between the initial resistance and the final resistance in a linear fashion.

FIG. 4A illustrates a schematic representation of some embodiments of a damping component 400 (e.g., damping component 102 of FIG. 1). An input node (IN) of the damping component 400 is connected to the inductor with inductance ($L_{pkg}$) 116 in the electronic design file 100 of FIG. 1. Likewise, an output node (OUT) is connected to the first pin 108 in the electronic design file 100 of FIG. 1. For the embodiments of FIG. 4A, the damping component 400 comprises a voltage-controlled resistor (VCR) 402, where the resistance between the input node (IN) and the output node (OUT) is controlled by a voltage control source ($V_{ctrl}$), which is time-dependent, and which changes the resistance of the VCR 402 as a function of the voltage control source ($V_{ctrl}$). In one embodiment, the VCR 402 has a time-dependent resistance ($R_T$), which varies between an initial resistance ($R_i$) and a final resistance ($R_f$) in a linear fashion. Final resistance is modeled to be zero to reduce IR-drop. If implemented in an actual IC, the resistance will not be perfectly zero in some implementations, but will be substantially zero or as near to zero as possible to reduce IR-drop.

Figure 4B:
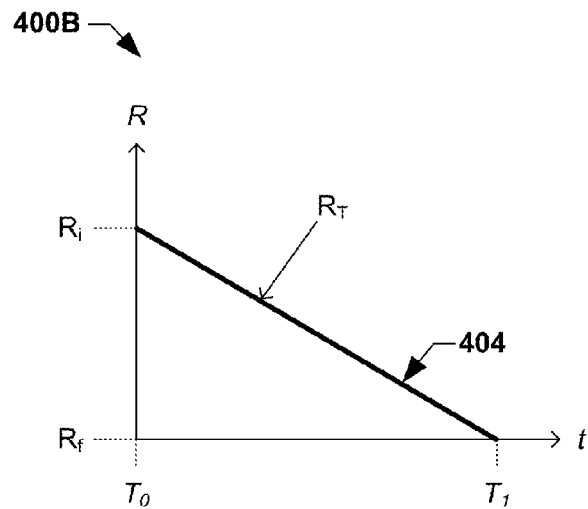

FIG. 4B illustrates a resistance-time characteristic 400B of the damping component 400 of FIG. 4A. As shown in FIG. 4B, the time-dependent resistance ($R_T$) of damping component 402 varies linearly between the initial resistance ($R_i$) and the final resistance ($R_f$). In some embodiments, the initial resistance is equal to $(L_{pkg}/C_{die})^{1/2}$ (Ohm), and the final resistance is substantially zero (ohm). Measurements of the damping component 400 of FIG. 4A show that the linear resistance-time characteristic 400B, which utilizes an $R_i=(L_{pkg}/C_{die})^{1/2}$ and $R_f=0$, gives a substantial reduction (e.g., over 90%) in convergence in resonance time, relative to a solution where the damping component 102 is omitted. An $R_i$ value of $(L_{pkg}/C_{die})^{1/2}$ equates to one-half of a critical resistance of $2\times(L_{pkg}/C_{die})^{1/2}$ of the RLC-Loop 300 of FIG. 3. Additionally, further measurements of the damping component 400 of FIG. 4A demonstrate a convergence to the resonant condition within a time period (T1) that is twice the resonant period of $2\pi(L_{pkg}\times C_{die})^{1/2}$ of the RLC-Loop 300 of FIG. 3 (i.e., within $T_1=4\pi(L_{pkg}\times C_{die})^{1/2}$ (sec)). This results in the linear plot $R_T$ having a slope that is equal to $1/4\pi C_{die}$ (Ohm/sec). Accordingly, the control voltage (VCtrl) is applied to the variable resistor VCR 402 by a controller to tune resistance of VCR in time to follow $R_T$ of FIG. 4B. Again, at T0 the simulation is initiated, and at T1 a steady state resonant condition is reached.

Figure 5A:
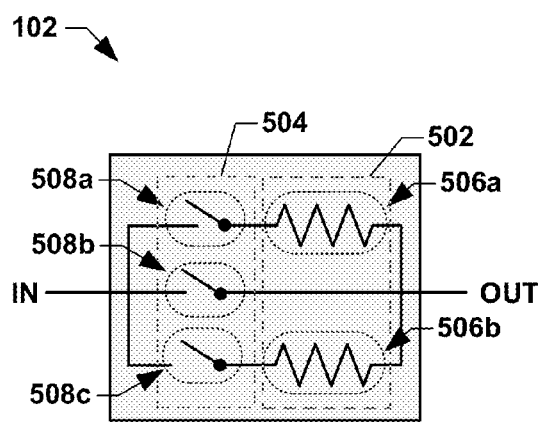
FIGS. 5A-5B illustrate a schematic representation of some embodiments of the damping component of FIG. 1 and associated resistance-time characteristic, which varies between the initial resistance and the final resistance in a step-wise fashion.

FIG. 5A illustrates a schematic representation of some alternative embodiments of the damping component 500 (e.g., damping component 102 of FIG. 1). The damping component 500 comprises a resistor bank 502 comprising a plurality of switchable resistors 506a-506b which are selectively coupled between an input node (IN) and an output node (OUT) by a switching network 504 comprising a plurality of switches 508a-508c. In some embodiments, the switching network 504 comprises first, second, and third switches 508a, 508b, and 508c configured to operate independently under direction of a controller. The first switch 508a is connected to a first resistor 506a and is configured to enable current flow through the first resistor 506a between the input node (IN) and output node (OUT) of the damping component 500. The second switch 508b is configured to enable current flow between the input node (IN) and output node (OUT). The third switch 508c is connected to a second resistor 506b and is configured to enable current flow through the second resistor 506b between the input node (IN) and output node (OUT).

Figure 5B:
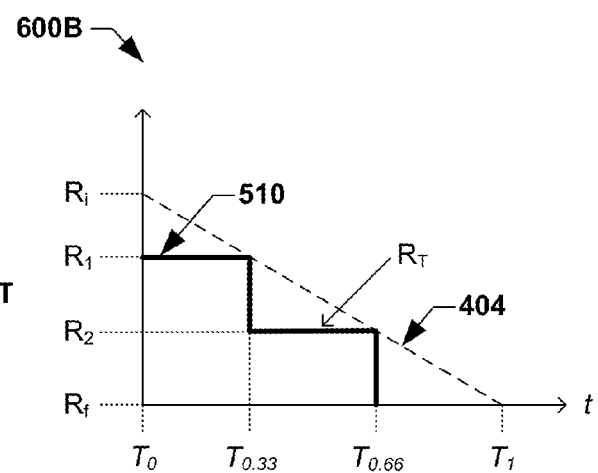

FIG. 5B illustrates a resistance-time characteristic 500B of the time-dependent resistance ($R_T$) of the damping component 500 of FIG. 5A. For the embodiments of FIGS. 5A-5B, the first-third switches 508a-508c are closed successively to vary $R_T$ between the input node (IN) and the output node (OUT) from the initial resistance ($R_i$) to the final resistance ($R_f$) in a step-wise fashion. At $T_0$ the first switch 508a is closed while the second and third switches 508b, 508c are left open, which enables a first resistance ($R_1$) of the damping component 500 (where $R_1<R_i$). At $T_{0.33}$ the third switch 508c is closed, while the first switch 508a remains closed and the second switch 508b remains open, which reduces a resistance of the damping component 102 from $R_1$ to $R_2$. At $T_{0.66}$ the second switch 608b is closed, while the first and third switches 508a, 508b are opened, which reduces a resistance of the damping component 500 from $R_2$ to about zero. For the embodiments of the resistance-time characteristic 500B, a step-wise plot 510 of the time-dependent resistance ($R_T$) is coincident or below the linear plot 404 between the initial resistance ($R_i$) and the final resistance ($R_f$). The resistance of the first and second resistors 506a, 506b may again be tuned so that the time-dependent resistance ($R_T$) remains coincident or below the linear plot 404.

It is appreciated that modifications to damping components 400, 500 of FIGS. 4A and 5A may be employed, where a time-dependent resistance of a damping component 102 comprises a resistance ($R_T$) that varies between an initial resistance ($R_i$) associated with a critical damping resistance of the RLC-Loop 300 of FIG. 3 and a final resistance ($R_f$) less than the initial resistance ($R_i$), and where the variation occurs over a time period associated with the resonant period of the RLC-Loop 300 of FIG. 3. For example, although FIG. 5A shows only two steps, only a single step or more than two steps can also be included.

Figure 6:
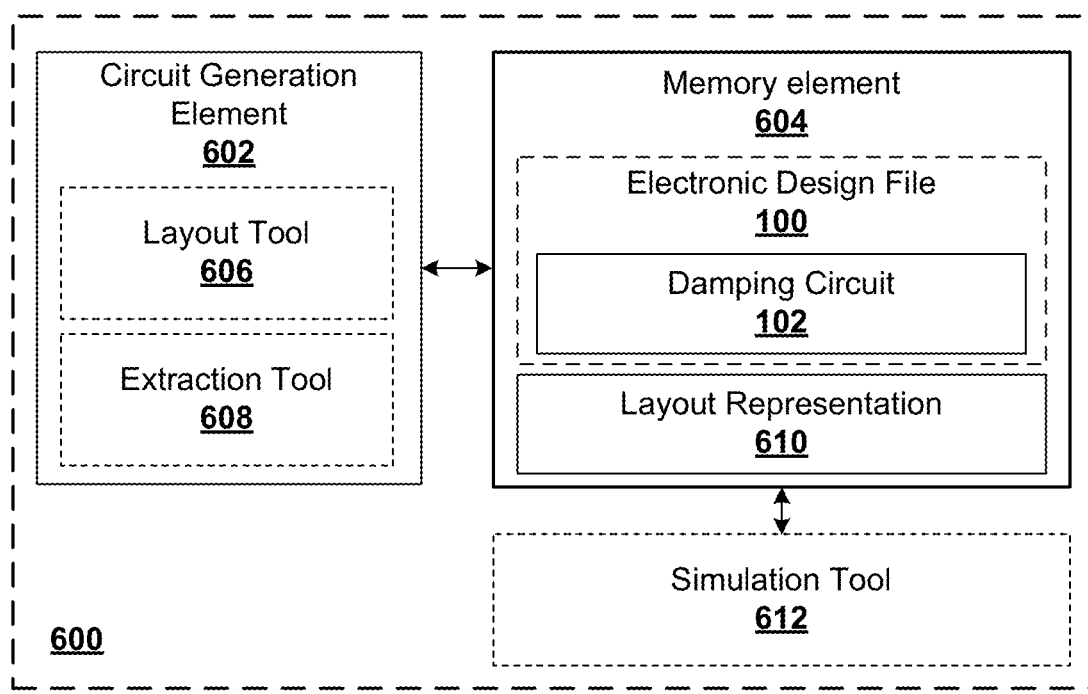
FIG. 6 illustrates some embodiments of a tool arrangement configured to simulate an electronic design file which includes capacitive and inductive components of a packaged IC.

FIG. 6 illustrates some embodiments of a tool arrangement 600 configured to generate the electronic design file 100 of FIG. 1 for simulating a resonant condition for a packaged IC.

The tool arrangement 600 comprises a circuit generation element 602 and a memory element 604. The circuit generation element 602 is configured to generate the electronic design file 100 of FIG. 1 having a damping component 102 configured to reduce a time for achieving resonance convergence in an RLC-Loop of the electronic design file 100. The memory element 604 is configured to store the electronic design file 100.

In some embodiments, the circuit generation element 602 comprises a layout design tool 606 and an extraction tool 608. The layout design tool 606 is configured to produce a layout representation 610 of a packaged integrated chip, comprising an LC-Loop portion having a capacitive component and an inductive component. In some embodiments, the layout representation 610 may comprise the IC component 104 of FIG. 1), the package component 106 of FIG. 1, one or more devices (e.g., inductors, capacitors, resistors, etc.), and the connections formed between the devices (e.g., a netlist formed from the connecting wires, first and second pins 108, 110, wirebonds, solder bumps, etc.). It will be appreciated that within layout representation 610, components of the packaged IC comprise physical shapes of a design layer. In some embodiments, the layout representation 610 may be stored within the memory element 604.

The extraction tool 612 is configured to determine electrical parameters from the layout representation 610, which are used within the electronic design file 100. For instance, the extraction tool 612 may be configured to determine the on-die capacitance ($C_{die}$) 112, the die resistance ($R_{die}$) 114, the package inductance ($L_{pkg}$) 116, the package capacitance ($C_{pkg}$) 118, and/or the modeled board resistance ($R_{brd}$) 120 of the electronic design file 100.

The circuit generation element 602 is further configured to generate the damping component 102 of FIG. 1. In some embodiments, the circuit generation element 602 is configured to generate the damping component 102 comprising a time-dependent resistance ($R_T$) derived from the electrical parameters that are calculated by the extraction tool 612 (e.g., $C_{die}$, $R_{die}$, $L_{pkg}$, $C_{pkg}$, and $R_{brd}$).

For example, in some embodiments, the circuit generation element 602 is configured to evaluate a resonant state of the electronic design file 100, which neglects a capacitance of the package $C_{pkg}$ 118 and the resistance terms ($R_{die}$ 114 and $R_{brd}$ 120) to approximate the electronic design file 100 as the RLC-Loop 300 of FIG. 3 having an inductance value of $L_{pkg}$ and a capacitance value of $C_{die}$. From the RLC-Loop 300, the time-dependent resistance $R_T$ can be calculated to vary in time between an initial value $R_T(0)=R_i=(L_{pkg}/C_{die})^{1/2}$, which is equal to one-half the critical resistance of $2\times(L_{pkg}/C_{die})^{1/2}$ of the RLC-Loop 300, and a final value $R_f$ of zero (0). $R_T$ is further determined to have a time period ($T_R$) that is twice the resonant period of $2\pi(L_{pkg}\times C_{die})^{1/2}$ of the RLC-Loop 300, $T_R=4\pi(L_{pkg}\times C_{die})^{1/2}$. Once $R_i$, $R_f$, and $T_R$ are determined, the circuit generation element 602 is configured to adjust the damping component 102 to have a resistance that varies in time along a slope that meets $R_i$, $R_f$, and $T_R$. For example, the resistance can vary in a linear fashion from $R_i$ to $R_f$ (see e.g., FIG. 4B), or can varies in step-wise fashion from $R_i$ to $R_f$ (see e.g., FIG. 5B).

It will be appreciated that once the values for $R_T$ are known the damping component 102 may be constructed in any manner that meets $R_i$, $R_f$ and $T_R$. For example, the damping component 102 of FIGS. 4A-4B is one example that meets these values. The damping component 102 of FIGS. 5A-5B is another example that meets these values.

In some embodiments, the tool arrangement may further comprise a simulation tool 612 configured to model a resonant condition between various R, L, and C components of the electronic design file 100. By modeling a resonant condition between capacitive and inductive components using the electronic design file 100, the simulation time of the electronic design file 100 is reduced. In some embodiments, the simulation tool 612 comprises Simulation Program with Integrated Circuit Emphasis (SPICE) software.

Figure 7:
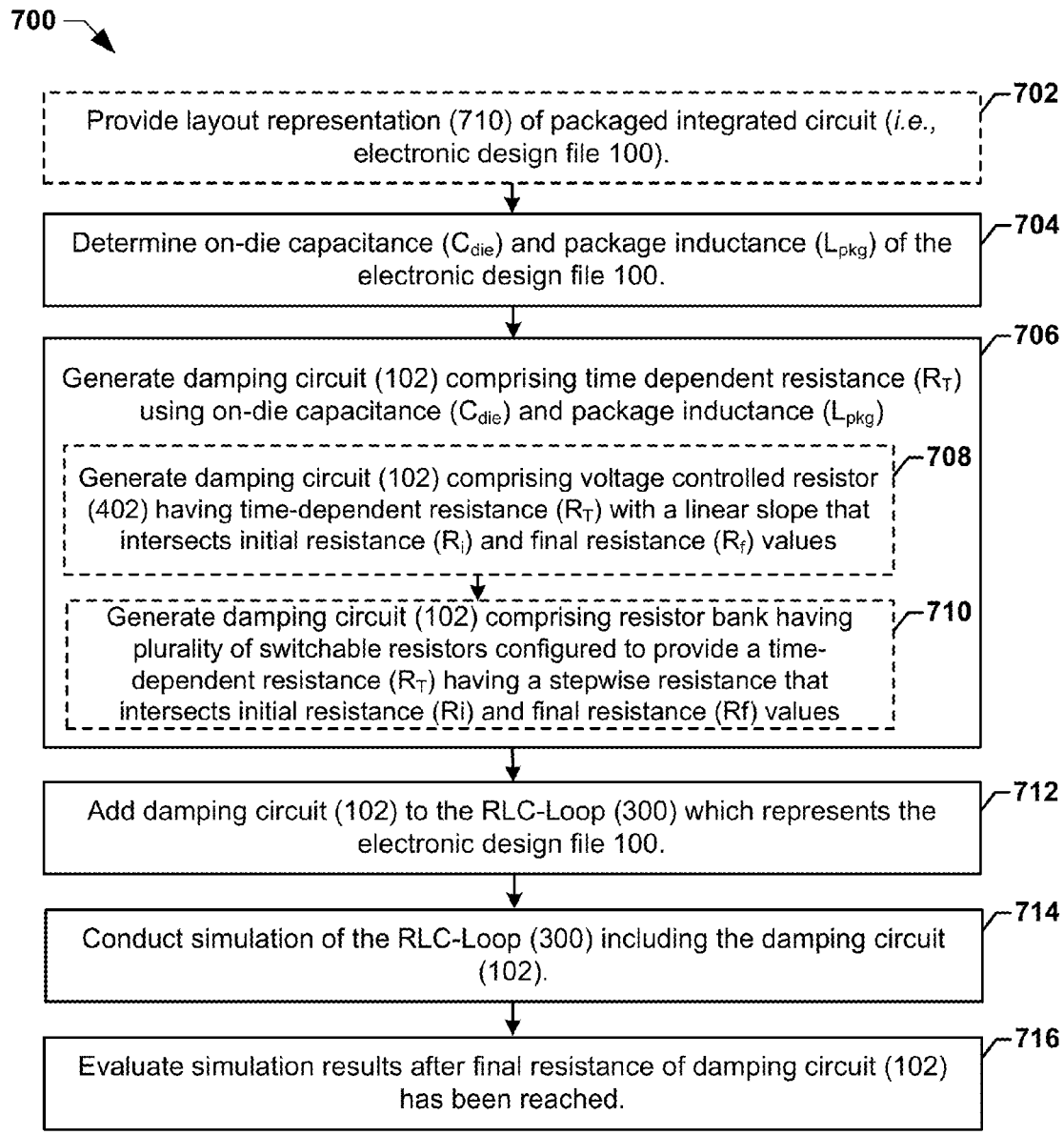
FIG. 7 illustrates some embodiments of a method for simulating a resonant condition for the electronic design file of FIG. 1.

FIG. 7 illustrates some embodiments of a method 700 for simulating a resonant condition for the electronic design file 100 of FIG. 1.

It will be appreciated that while the method 700 is illustrated and described as a series of acts or events, that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases. Furthermore, the disclosed methods may be implemented as an apparatus, or article of manufacture using standard programming and/or engineering techniques to produce software, firmware, hardware, or any combination thereof to control a computer to implement the disclosed subject matter.

At 702, the layout representation 610 of a packaged IC may be provided to an extraction tool 612. In various embodiments, the layout representation 710 is that of the IC component 104, or both the IC component 104 and package component 106 of the electronic design file 100.

At 704, an on-die capacitance ($C_{die}$) 112 and a package inductance ($L_{pkg}$) 116 associated with the electronic design file 100 are determined. In some embodiments, the on-die capacitance ($C_{die}$) 112 and the package inductance ($L_{pkg}$) 116 may be determined by operating upon the layout representation 610 of the electronic design file 100 with the extraction tool 612. In some embodiments, the on-die capacitance ($C_{die}$) 112 and the package inductance ($L_{pkg}$) 116 may be determined by separately acts. For example, in some embodiments, $C_{die}$ 112 may be exacted from the layout representation 610 of the IC component 104, while a known value of the package inductance ($L_{pkg}$) 116 of the package component 106 which is reused for many different die components 104 in various packaged ICs can be applied.

At 706, a damping component 102 comprising a time-dependent resistance ($R_T$) is generated based on the determined on-die capacitance ($C_{die}$) and package inductance ($L_{pkg}$) associated with the packaged IC. In some embodiments, the damping component 102 is generated to have time-dependent resistance ($R_T$) that is reduced from an initial resistance value $R_i$ along a slope of the time-dependent resistance ($R_T$) (e.g., an initial value divided by a time period). For example, the time-dependent resistance ($R_T$) may be calculated to have an initial resistance value $R_T(0)=R_i=(L_{pkg}/C_{die})^{1/2}$, which is equal to one-half the critical resistance of $2\times(L_{pkg}/C_{die})_{1/2}$ of the RLC-Loop 300 of FIG. 3). The time-dependent resistance ($R_T$) is further determined to have a time period ($T_R$) that is twice the resonant period of $2\pi(L_{pkg}\times C_{die})^{1/2}$ of the RLC-Loop 300, $T_R=4\pi(L_{pkg}\times C_{die})^{1/2}$. Since the time period ($T_R$) is the time during which the time-dependent resistance ($R_T$) goes from the initial resistance value $R_i$ to a final resistance value $R_f=0$, the slope can be determined by dividing the initial resistance value $R_i$ by the time period ($T_R$).

In some embodiments, the damping component 102 is generated to comprise the voltage controlled resistor 402 of FIG. 4A having a time-dependent resistance ($R_T$) with a linear time response (i.e., dR/dt slope) that intersects the initial resistance value $R_i$ and the final resistance value $R_f$, at 708. For example, as an applied voltage $V_{ctrl}$ provided to the voltage controlled resistor 402 varies, the time-dependent resistance ($R_T$) of the voltage controlled resistor 402 will vary between the initial resistance value $R_i=(L_{pkg}/C_{die})^{1/2}$ and the final resistance value $R_f=0$.

In other embodiments, the damping component 102 is generated to comprise the resistor bank 502 of FIG. 5A having plurality of switchable resistors 506a-506c configured to provide a time-dependent resistance ($R_T$) having a step-wise resistance that intersects the initial resistance ($R_i$) and final resistance ($R_f$) values, at 710. One or more of the plurality of switchable resistor 506a-506c may be selectively coupled between an input (IN) of the damping component 102 and an output (OUT) of the damping component 102 by a switching network 504 so as to change a resistive value of the damping component 102 in a step-wise manner with respect to time.

For example, in an initial switching configuration (e.g., at time t=T0 the switching network 504 may be operated to couple a first set of resistors between the input (IN) and the output (OUT) of the damping component 102 to provide a resistance that is equal to the initial resistance value $R_i$. In a second switching configuration (e.g., at time t=T0.33, the switching network 504 may be operated to couple a second set of resistors between the input (IN) and the output (OUT) of the damping component 102 to provide for a resistance that is between the initial resistance value $R_i$ and the final resistance value $R_f$. In a final switching configuration (e.g., at time t=$T_{0.66}$), the switching network 504 may be operated to directly connect the input (IN) to the output (OUT) of the damping component 102, so as to provide for a final resistance value $R_f$ of zero.

At 712, the damping component 102 is added to the RLC-Loop 300 of FIG. 3. In some embodiments, the damping component 102 is added adjacent to each inductor of the electronic design file 100. In some embodiments, the damping component 102 is inserted at ports that represent power connections between the IC component 104 and package component 106 of the electronic design file 100. In some embodiments, the RLC-Loop 300, damping component 102, and the electronic design file 100 comprise SPICE source code.

At 714, a simulation of the RLC-Loop 300 including the damping component 102 is performed.

At 716, the simulation results of the packaged IC are evaluated after the final resistance (i.e., 0) of the RLC-Loop 300 has been reached. Upon reaching the final resistance, the energy exchange between the various R, L, and C components of the RLC-Loop 300 reaches a resonant condition. After the resonant condition is met, simulation of the packaged IC by the revised the RLC-Loop 300 may be performed in the simulation tool 612 of FIG. 6 to model power delivery to the IC. In some embodiments, a SPICE simulation tool is utilized to perform a full-chip dynamic voltage drop for the packaged IC with the RLC-Loop 300.

It will be appreciated that equivalent alterations and/or modifications may occur to those of ordinary skill in the art based upon a reading and/or understanding of the specification and annexed drawings. The disclosure herein includes all such modifications and alterations and is generally not intended to be limited thereby.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Some embodiments of the present disclosure provide for a method. The method provides an electronic design file that includes an integrated circuit (IC) component that is operably coupled to a package component. The IC component and package component collectively form a resistor inductor capacitor (RLC) resonant circuit. The method provides a damping component in the electronic design file. The damping component is configured to reduce a pre-resonant time during which energy exchanged in the RLC resonant circuit approaches a steady-state.

Other embodiments relate to a packaged integrated circuit (IC). The packaged IC includes an IC component disposed on a piece of semiconductor material, as well as a package component having pins that are operably coupled to the IC component. The IC component and package component collectively form a resistor inductor capacitor (RLC) resonant circuit. The packaged IC also includes a damping component configured to reduce a pre-resonant time during which energy exchanged in the RLC resonant circuit approaches a steady-state.

Still other embodiments relate to a tool arrangement. The tool arrangement includes a memory element configured to store a layout representation of a packaged integrated circuit (IC). The packaged IC includes a capacitive component and an inductive component that collectively establish an RLC circuit. The memory element is further configured to store a damping component comprising a time-dependent resistance based on the on-die capacitance and the package inductance. The damping component is configured to reduce a pre-resonant time period of the RLC circuit, during which energy exchanged between the capacitive and inductive components approaches a steady-state.

What is claimed is:
1. A method, comprising:
   providing an electronic design file that includes an integrated circuit (IC) component that is operably coupled to a package component, wherein the IC component and package component collectively form a resistor inductor capacitor (RLC) resonant circuit;
   providing a damping component in the electronic design file, wherein the damping component is configured to reduce a pre-resonant time during which the RLC resonant circuit approaches a resonant condition, wherein the damping component comprises a time-dependent resistance that decreases from an initial resistance to a final resistance that is less than the initial resistance, wherein the initial resistance is proportional to $(L/C)^{1/2}$, and wherein L comprises a package inductance and C comprises a die capacitance;
   performing a first simulation of the RLC resonant circuit with the damping component, the first simulation being performed until the resonant condition is met;
   when the resonant condition is met, performing a second simulation to model power delivery to the IC component based on the electronic design file; and selectively manufacturing the IC component on a substrate based on results of the second simulation.

2. The method of claim 1, wherein the resonant condition is met when the final resistance is substantially zero.

3. The method of claim 1, wherein a time period over which the time-dependent resistance decreases from the initial resistance to the final resistance is a resonant period of the RLC resonant circuit.

4. The method of claim 3, wherein the time period is $2\times(2\pi(LC)^{1/2})$.

5. The method of claim 1, wherein the time-dependent resistance varies between the initial resistance and the final resistance in a linear fashion.

6. The method of claim 1, wherein the time-dependent resistance varies between the initial resistance and the final resistance in a step-wise fashion.

7. The method of claim 1, further comprising:
selectively providing an error message in the first simulation or second simulation based on whether a voltage signal as provided on pins of the IC component oscillates about a target DC offset by more than a predetermined threshold.

8. A packaged integrated circuit (IC), comprising:
an integrated circuit (IC) component disposed on a piece of semiconductor material;
a package component having pins that are operably coupled to the IC component, wherein the IC component and package component collectively form a resistor inductor capacitor (RLC) resonant circuit; and
a damping component configured to reduce a pre-resonant time, during which energy exchanged in the RLC resonant circuit approaches a steady-state, by providing a time-dependent resistance that decreases from an initial resistance to a final resistance that is less than the initial resistance, wherein the initial resistance comprises $(L/C)^{1/2}$, wherein L comprises a package inductance and C comprises a die capacitance.

9. The packaged IC of claim 8, wherein a time period over which the initial resistance is decreased to the final resistance is $2\times(2\pi(LC)^{1/2})$.

10. The packaged IC of claim 8, wherein the resistance varies between the initial resistance and the final resistance in a linear fashion.

11. The packaged IC of claim 8, wherein the resistance varies between the initial resistance and the final resistance in a step-wise fashion.

12. The packaged IC of claim 8, wherein the final resistance is substantially zero.

13. A method, comprising:
providing an electronic design file that includes an integrated circuit (IC) component that is operably coupled to a package component, wherein the IC component and package component collectively form a resistor inductor capacitor (RLC) resonant circuit;
providing a damping component in the electronic design file, wherein the damping component is configured to reduce a pre-resonant time during which energy exchanged in the RLC resonant circuit approaches a steady-state;
performing a simulation of the RLC resonant circuit with the damping component based on the electronic design file, the simulation being performed until a resonant condition is met;
evaluating the resonant condition after a final resistance of the RLC resonant circuit has been reached; and
when the resonant condition is met, selectively manufacturing the IC component on a substrate based on results of the simulation.

14. The method of claim 13, wherein an initial resistance of the RLC resonant circuit before the resonant condition is met is proportional to $(L/C)^{1/2}$, wherein L comprises a package inductance and C comprises a die capacitance.

15. The method of claim 14, wherein a resistance of the RLC resonant circuit varies between an initial resistance and the final resistance in a linear fashion.

16. The method of claim 14, wherein a resistance of the RLC resonant circuit varies between the initial resistance and the final resistance in a step-wise fashion.

17. The method of claim 13, wherein the resonant condition is met when the final resistance is substantially zero.

18. The method of claim 13, wherein a time period over which resistance of the RLC resonant circuit decreases from an initial resistance to the final resistance is a resonant period of the RLC resonant circuit.

19. The method of claim 18, wherein the time period is proportional to $2\times(2\pi(LC)^{1/2})$, wherein L comprises a package inductance and C comprises a die capacitance.

* * * * *